(12) United States Patent
Chen

(10) Patent No.: US 7,563,509 B2
(45) Date of Patent: Jul. 21, 2009

(54) ARTICLE WITH PROTECTIVE FILM

(75) Inventor: Ga-Lane Chen, Santa Clara, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 227 days.

(21) Appl. No.: 11/309,503

(22) Filed: Aug. 14, 2006

(65) Prior Publication Data

US 2007/0114637 A1 May 24, 2007

(30) Foreign Application Priority Data

Nov. 18, 2005 (TW) ................. 094140606

(51) Int. Cl.
*B32B 9/00* (2006.01)

(52) U.S. Cl. .............. 428/408; 428/216; 428/336; 428/698

(58) Field of Classification Search ........ 428/216, 428/336, 408, 698
See application file for complete search history.

(56) References Cited

U.S. PATENT DOCUMENTS

| 5,232,570 | A | * | 8/1993 | Haines et al. | 204/192.16 |
| 5,507,930 | A | * | 4/1996 | Yamashita et al. | 204/192.15 |
| 5,837,357 | A | * | 11/1998 | Matsuo et al. | 427/577 |
| 5,846,613 | A | * | 12/1998 | Neuville | 204/192.12 |
| 6,562,445 | B2 | | 5/2003 | Iwamura | |
| 6,576,095 | B2 | * | 6/2003 | Chen | 204/192.16 |
| 7,175,926 | B2 | * | 2/2007 | Ma et al. | 204/192.2 |

* cited by examiner

*Primary Examiner*—Archene Turner
(74) *Attorney, Agent, or Firm*—Frank R. Niranjan

(57) ABSTRACT

An article includes a substrate, a transition layer, and a diamond like carbon film. The transition layer is directly formed on a surface of the substrate. The diamond like carbon film is deposited on the transition layer, in contact therewith. The diamond like carbon film includes a nitrogen-doped diamond like carbon layer, a nitrogen-hydrogen doped diamond like carbon layer, and a hydrogen-doped diamond like carbon layer formed on the transition layer, in series. The nitrogen-doped diamond like carbon layer, in particular, is immediately adjacent the transition layer.

15 Claims, 2 Drawing Sheets

ARTICLE WITH PROTECTIVE FILM

FIELD OF THE INVENTION

The present invention generally relates to articles with a protective film thereon and, more particularly, to an article with a protective film incorporating diamond like films.

DESCRIPTION OF RELATED ART

Diamond like carbon is a mostly metastable amorphous material but can include a microcrystalline phase. Diamond like carbon contains both $sp^2$ and $Sp^3$ hybridized carbon atoms. Diamond like carbon typically includes amorphous carbon (a-C) and hydrogenated amorphous carbon (a-C:H) containing a significant $Sp^3$ bonding. The amorphous carbon containing 85% or more of $Sp^3$ bonding is called highly tetrahedral amorphous carbon (ta-C). The $Sp^3$ bonding affords valuable diamond like properties such as high mechanical hardness, low friction, optical transparency and chemical inertness onto a diamond like carbon film. The diamond like carbon film has some further advantages, such as being capable of deposition at room temperature, capable of deposition onto steel or plastic substrates and superior surface smoothness.

Because of excellent properties such as corrosion resistance and wear resistance, the diamond like carbon film is a suitable protective film material for various articles such as molds, cutting tools and hard disks. However, the diamond like carbon film often has a poor adhesion to a substrate. Due to this problem, commercial application of the diamond like carbon film is restricted to a certain extent.

Therefore, it is desired to provide an improved article with a protective film that overcomes the above-described problems.

SUMMARY OF THE INVENTION

An article includes a substrate, a transition layer, and a diamond like carbon film. The transition layer is directly formed on a surface of the substrate. The diamond like carbon film is deposited on the transition layer and in contact therewith. The diamond like carbon film includes a nitrogen-doped diamond like carbon layer, a nitrogen-hydrogen doped diamond like carbon layer, and a hydrogen-doped diamond like carbon layer formed on the transition layer, in series. The nitrogen-doped diamond like carbon layer, in particular, is immediately adjacent the transition layer.

Advantages and novel features will become more apparent from the following detailed description when taken in conjunction with the accompanying drawings.

BRIEF DESCRIPTION OF THE DRAWINGS

Many aspects of the present article can be better understood with reference to the following drawings. The components in the drawings are not necessarily drawn to scale, the emphasis instead being placed upon clearly illustrating the principles of the present article. Moreover, in the drawings, like reference numerals designate corresponding parts throughout the several views.

DETAILED DESCRIPTION OF THE INVENTION

Figure 1:
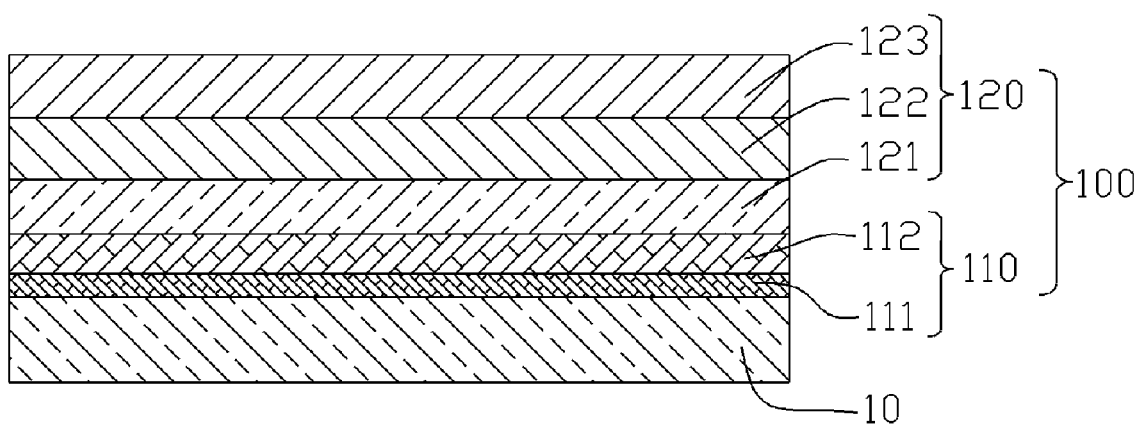
FIG. 1 is a schematic view of an article with a protective film, in accordance with a preferred embodiment.

Referring to FIG. 1, an article 20, for example, a mold core 20 includes a substrate 10 and a protective film 100 formed on a surface of the substrate 10. The protective film 100 generally includes a transition layer 110 and a diamond like carbon layer 120. The transition layer 110 includes an adhesive layer 111 and an intermediate layer 112. The diamond like carbon layer 120 includes a nitrogen-doped diamond like carbon (a-CN) layer 121, a nitrogen-hydrogen doped diamond like carbon (a-CNH) layer 122, and a hydrogen-doped diamond like carbon (a-CH) layer 123. The aforementioned five layers 111, 112, 121, 122 and 123 are formed on the surface of the substrate 10, in series. Particularly advantageously, the adhesive layer 111 is directly formed on the surface of the substrate 10, and each succeeding layer is directly formed on (i.e., in contact with) the layer preceding it in the series.

The substrate 10 may, beneficially, be made of stainless steel or another alloys. Such an alloy may advantageously be chosen from the group including iron-chromium-carbon (Fe—Cr—C) alloys, iron-chromium-molybdenum-carbon (Fe—Cr—Mo—C) alloys, iron-chromium-vanadium-molybdenum-carbon (Fe—Cr—V—Mo—C) alloys, and iron-chromium-vanadium-silicon-molybdenum-carbon (Fe—Cr—V—Si—Mo—C) alloys. The adhesive layer 111 may, usefully, be made of chromium, titanium, or chromium titanium (CrTi), or an alloy including enough of at least one of such metals to achieve the desired level of adhesion. A thickness of the adhesive layer 111 is advantageously in a range from about 1 nanometer to about 20 nanometers. Preferably, the thickness of the adhesive layer 110 is in a range from about 4 nanometers to about 10 nanometers. The intermediate layer 112 may, usefully, be made of chromium nitride (CrN), titanium nitride (TiN), or chromium titanium nitride (CrTiN). A thickness of the intermediate layer 112 is in a range from about 1 nanometer to about 50 nanometers. Preferably, the thickness of the intermediate layer 112 is in a range from about 4 nanometers to about 30 nanometers. As for the diamond like carbon layer 120, a thickness of the nitrogen-doped diamond like carbon layer 121, the nitrogen-hydrogen doped diamond like carbon layer 122, and the hydrogen-doped diamond like carbon layer 123 separately are each in a range from about 1 nanometer to about 50 nanometers, preferably, separately is in a range from about 10 nanometers to about 30 nanometers.

Regarding the mold core 20, the material of the substrate 10 has a different crystal structure than the material of the diamond like carbon layer 120. Accordingly, the diamond like carbon layer 120 is, typically, uneasily directly formed onto the substrate 10. The transition layer 110 created between the substrate 10 and the diamond like carbon layer 120 not only adapts to adhere to the surface of the substrate 10 but also can firmly combine with the diamond like carbon layer 120. As such, the diamond like carbon layer 120 can firmly adhere to the surface of the substrate 10 via the transition layer 110. The transition layer 110 may be a single layer film or a multilayer film. In the present embodiment, the transition layer 110 has two film layers, to make the diamond like carbon layer 120 easily and firmly adhere to the surface of the mold core 20.

Regarding the layer structure of the diamond like carbon layer 120, the a-CN layer 121, the a-CNH layer 122 and the a-CH layer 123 are made of interrelated materials, with a crystal structure of such interrelated materials readily adapting to each other. Thus, the adjacent layers, by being made of such interrelated materials, can be combined firmly. For example, because the a-CNH layer 122 not only contains nitrogen atom, which is doped in the a-CN layer 121, but also contains hydrogen atom, which is doped in the a-CH layer 123, the a-CNH layer 122 firmly combine both with the a-CN layer 121, and with the a-CH layer 123. Thus, the diamond like carbon layer 120 with a compact configuration is obtained.

In addition, the general diamond like carbon (a-C) film formed on surfaces of mold cores can enable the mold cores having a high surface rigidity, a low friction coefficient, a high corrosion resistance, etc. Doping hydrogen and/or nitrogen in the a-C film can greatly improve mechanical properties of the a-C film. For example, the a-CN layer 121 has a better adhesion, the a-CH layer 123 has a lower friction coefficient, and the a-CNH layer 122 has a lower internal stress. In the present protective film 100, the a-CN layer 121 can better adhere to both of the transition layer 110 and the a-CNH layer 122. Having lower internal stress, the a-CNH layer 122 enables the a-CH layer 123 and the a-CN layer 121 to adapt each other perfectly or at least nearly so. As an outmost layer, the a-CH layer 123 can give the mold core 20, as a whole, a higher corrosion resistance, a lower friction coefficient, and a good wear resistance.

Figure 2:
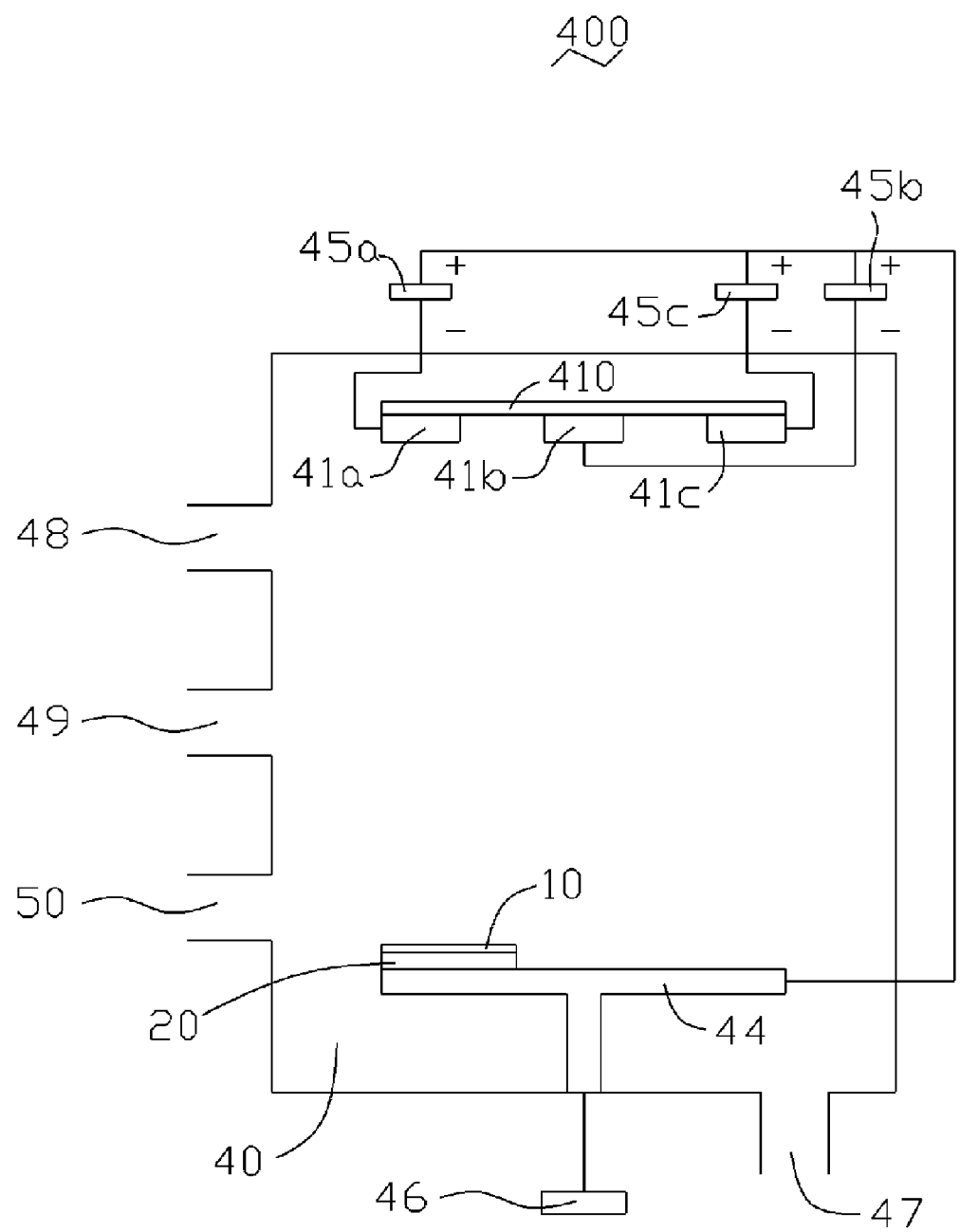
FIG. 2 is schematic view of a sputtering apparatus for forming the protective film on the article.

Referring to FIG. 2, a sputtering apparatus 400 for forming the protective film 100 on the surface of the substrate 10 is illustrated. The sputtering apparatus 400 may, advantageously, be a radio frequency (RF) sputtering apparatus and, in the illustrated embodiment, includes a vessel 40, a base 44, a fixture 410, three RF power supplies 45a, 45b, 45c, and a bias power supply 46. The vessel 40 has a high vacuum cavity (not labeled), and includes a gas outlet 47, a first gas inlet 48, a second gas inlet 49, and a third gas inlet 50 separately in communication with the cavity. The base 44 and the fixture 410 are arranged within the vessel 40, facing each other, and the fixture 410 is spaced from the base 44. The base 44 is rotatable, and the mold core 20 is arranged on the base 44 with a surface of the substrate 10, upon which the protective film 100 to be formed, left exposed. The mold core 20 can rotate together with the base 44.

A first target 41a, a second target 41b and a third target 41c are fixed on the fixture 410. The fixture 410 is rotatable, and the three aforementioned targets may rotate together with the fixture 410. The first target 41a is made of chromium, titanium, or chromium titanium, the material used for forming the adhesive layer 111 on the substrate 10. The second target 41b is made of chromium nitride, titanium nitride, or chromium titanium nitride, as the source of the material for the intermediate layer 112 to be formed directly on the adhesive layer 111. The third target 41c is made of graphite, to be used in the formation of the three diamond like carbon layers 121, 122 and 123.

Each anode of the RF power supplies 45a, 45b and 45c is separately connected with the substrate 10, and each cathode of the RF power supplies 45a, 45b and 45c is separately connected with the first target 41a, the second target 41b and the third target 41c. Each working frequency of the RF power supplies 45a, 45b and 45c is, advantageously, 13.56 MHz. In the sputtering process, an appropriate voltage of RF field is provided, and then ion beams (such as positive ion beams or negative ion beams) are accelerated by the RF field to move to the target. Further, along with the movement of the ion beams, a positive bias or a negative bias may be formed on the target. The generated bias may weaken the original RF field, thereby slowing the speed of the ion beams. In order to retain the original speed of the ion beams, a proper bias is applied to the substrate 10 to counteract the generated bias to retain the original voltage of the RF field. That is, the bias power supply 46 can, usefully, be connected to the substrate 10, for supplying, e.g., a negative bias voltage to accelerate the sputtered positive ions to the substrate 10. The bias power supply 46 may be a direct current (DC) power supply or an alternating current (AC) power supply. In the present embodiment, the bias power supply 46 is an AC power supply. A working frequency of the bias power supply 46 is in a range from about 20 KHz to about 800 KHz., preferably, in a range from about 40 KHz to about 400 KHz. A working voltage of the bias power supply 46 is in a range from about −100 v to about −30 v, preferably, in a range from about −60 v to about −40 v.

In a sputtering process, a working gas is introduced in the vessel 40. The primary working gas is an inert gas that can not react with any of the targets 41a-41c or the produced coatings 111, 112, 121, 122 and 123. The primary working gas may be, e.g., argon (Ar), krypton (Kr), xenon (Xe), radon (Rn), or another appropriate mixed gas. In the present embodiment, three working gases are needed. In detail, argon is provided from the third gas inlet 50, hydrogen is provided from the second gas inlet 49, and nitrogen is provided from the first gas inlet 48. The hydrogen and nitrogen sources are needed to attain the desired doping in the diamond like carbon layers 121-123.

A method for sputtering the protective film 100 on the surface of the substrate 10 of the mold core 20 by employing the sputtering apparatus 400 includes the following steps. In a first step, the transition layer 110 is deposited directly on the surface of the substrate 10. In the present embodiment, the transition layer actually includes an adhesive layer 111 and an intermediate layer 112 on the surface of the substrate 10. In particular, the adhesive layer 111 is thereby immediately adjacent the substrate 10, and the intermediate layer 112 is coated in contact with a side of adhesive layer 111 opposite the substrate 10. In order achieve the first step, the air is pumped down from the vessel 40 via the gas outlet 47 to obtain an appropriate vacuum degree, and the gas outlet 47 is then closed. The gas inlet 50 is subsequently opened to provide argon to the vessel 40, while the gas inlet 48 and 49 are in a closed state.

Then, a titanium target 41a and the substrate 10 are spaced and arranged oppositely to one another (generally orthogonally, such that their surfaces are parallel), and the desired alignment being achieved by rotating the fixture 410 and/or the base 44. The RF power supply 45a is turned on, while the RF power supply 45b and 45c remain turned off. Then, the argon can be ionized to generate a reactive plasma for bombarding the target 41a, thereby generating a stream of titanium ions to deposit onto the surface of the substrate 10, resultingly forming the adhesive layer 111. After a certain time, when the adhesive layer 111 has reached at an appropriate thickness (such as the thickness in a range from about 1 nanometer to 20 nanometers, preferably, in a range from about 4 nanometers to about 10 nanometers), the RF power supply 45a is then shut off, and the sputtering process is stopped.

Next, the fixture 410 and/or the base 44 is rotated to arrange the titanium nitride target 41b and the substrate 10, with the adhesive layer 111 formed thereon, so as to be opposed and parallel to one another. The RF power supply 45b is turned on, while the RF power supply 45a and 45c are left off. Then, the argon can be ionized to generate a reactive plasma for bombarding the target 41b, generating a stream of titanium nitride ions to deposit onto the surface of the adhesive layer 111, thereby forming the intermediate layer 112 in direct contact thereon. A thickness of the intermediate layer 112 can be controlled via adjusting the sputtering time, working voltage, working frequency, for example. Beneficially, the thickness of the intermediate layer 112 is in a range from about 1 nanometer to about 50 nanometers and, preferably, in a range from about 4 nanometers to about 30 nanometers. Thus, a transition layer 110 composed of the adhesive layer 111 and the intermediate layer 112 is formed.

In a second general step, a nitrogen-doped diamond like carbon layer 121 is created on the surface of the transition layer 110 and, more specifically, on and in contact with the intermediate layer 112. This sputtering process is similar to that used in forming the transition layer 110, but the working gas of this sputtering process is different from that of the sputtering process for forming the adhesive layer 111 or the intermediate layer 112. Specifically, nitrogen is introduced into the cavity of the vessel 40 via the first gas inlet 48, while a portion of the argon is exported via the gas outlet 47. The overall working gas is a mixture of nitrogen and argon, with a percentage by volume of nitrogen being in a range from about 2% to about 40%, preferably, in a range from about 5% to about 20%. Secondly, the RF power supply 45c is turned on, while the RF power supply 45a and 45b remain turned off. Then, the mixed working gas can be ionized to generate a reactive plasma for bombarding the target 41c and to sputter-deposit the nitrogen doped diamond like carbon layer 121 onto the surface of the intermediate layer 112, due to the interaction of the carbon ions and the nitrogen gas. A thickness of the nitrogen-doped diamond like carbon layer 121 can be adjusted by controlling the sputtering time, sputtering voltage, and/or sputtering frequency, for example. Additionally, the thickness of the nitrogen-doped diamond like carbon layer 121 is in a range from about 1 nanometer to about 50 nanometers and, preferably, in a range from about 10 nanometers to about 30 nanometers.

In a third overall step, a nitrogen-hydrogen doped diamond like carbon layer 122 is created on and in contact with a surface of the nitrogen-doped diamond like carbon layer 121. This sputtering process is similar to the second step, but the working gas in this step is different. In the present step, the overall working gas is a mixture of nitrogen, hydrogen, and argon, with a percentage by volume of a mixture of nitrogen and hydrogen being in a range from about 2% to about 10%, preferably, in a range from about 5% to about 15%. The RF power supply 45c is turned on, while the RF power supply 45a and 45b remain turned off. Then, the mixed working gas is ionized to generate reactive plasma for bombarding the target 41c and to sputter-deposit the nitrogen-hydrogen doped diamond like carbon layer 122 onto a surface of the nitrogen doped diamond like carbon layer 121, due to the interaction of the carbon ions, the hydrogen gas and the nitrogen gas. A thickness of the nitrogen-hydrogen doped diamond like carbon layer 122 can be adjusted by controlling the sputtering time, voltage, and/or frequency, for example. Additionally, the thickness of the nitrogen-hydrogen doped diamond like carbon layer 122 is in a range from about 1 nanometer to about 50 nanometers and, preferably, in a range from about 10 nanometers to about 30 nanometers.

In a fourth overall step, a hydrogen-doped diamond like carbon layer 123 is created on and in contact with a surface of the nitrogen-hydrogen doped diamond like carbon layer 122. This sputtering process is similar to the second step, but the working gas in this step is different. In the present step, the overall working gas is a mixture of hydrogen and argon, with a percentage by volume of hydrogen being in a range from about 5% to about 20%. The RF power supply 45c is turned on, while the RF power supply 45a and 45b remain turned off. Then, the mixed working gas is ionized to generate a reactive plasma for bombarding the target 41c and to sputter-deposit the hydrogen-doped diamond like carbon layer 123 onto the nitrogen-hydrogen doped diamond like carbon layer 122. A thickness of the hydrogen doped diamond like carbon layer 123 can be adjusted by controlling the sputtering time, voltage, and/or frequency, for example. Additionally, the thickness of the hydrogen-doped diamond like carbon layer 123 is in a range from about 1 nanometer to about 50 nanometers and, preferably, in a range from about 10 nanometers to about 30 nanometers.

In the first to the fourth steps overall, the working frequency of the bias power supply 46 is in a range from about 20 KHz to about 800 KHz and, preferably, in a range from about 40 KHz to about 400 KHz. The working voltage of the bias power supply 46 is in a range from about −100 v to about −30 v and, preferably, in a range from about −60 v to about −40 v. Additionally, in the third and fourth steps, hydrogen can be replace by methane, ethane, or another appropriate gas to generate hydrogen atoms.

Alternatively, the sputtering process allows each layer of the protective film 100 to be formed by adjusting the deposition parameters, such as sputter pressure, sputter temperature, substrate bias, and the sputter gas ratio. According to the aforementioned process, the desired protective film 100 composed of a transition layer 110 and three layers of diamond like carbon layers 121, 122 and 123 can be obtained.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An article comprising:
a substrate;
a transition layer formed directly on the substrate; and
a diamond like carbon film formed on the transition layer and in contact therewith,
wherein the diamond like carbon film consists of a nitrogen-doped diamond like carbon layer, a nitrogen-hydrogen doped diamond like carbon layer, and a hydrogen-doped diamond like carbon layer, the nitrogen-hydrogen doped diamond like carbon layer is laminated between the nitrogen-doped diamond like carbon layer and the hydrogen-doped diamond like carbon layer, and the nitrogen-doped diamond like carbon layer is in contact with the transition layer.

2. The article as claimed in claim 1, wherein the transition layer comprises an adhesive layer and an intermediate layer.

3. The article as claimed in claim 2, wherein the adhesive layer is formed directly upon the substrate, the intermediate layer contacting both the adhesive layer and the nitrogen-doped diamond like carbon layer.

4. The article as claimed in claim 2, wherein the adhesive layer is comprised of a material selected from the group consisting of chromium, titanium and chromium titanium.

5. The article as claimed in claim 2, wherein a thickness of the adhesive layer is in a range from about 1 nanometer to about 20 nanometers.

6. The article as claimed in claim 5, wherein a thickness of the adhesive layer is in a range from about 4 nanometers to about 10 nanometers.

7. The article as claimed in claim 2, wherein the intermediate layer is comprised of a material selected from the group consisting of chromium nitride, titanium nitride and chromium titanium nitride.

8. The article as claimed in claim 2, wherein a thickness of the intermediate layer is in a range from about 1 nanometer to about 50 nanometers.

9. The article as claimed in claim 8, wherein a thickness of the intermediate layer is in a range from about 4 nanometers to about 30 nanometers.

10. The article as claimed in claim 1, wherein a thickness of the nitrogen-doped diamond like carbon layer is in a range from about 1 nanometer to about 50 nanometers.

11. The article as claimed in claim 10, wherein a thickness of the nitrogen-doped diamond like carbon layer is in a range from about 10 nanometers to about 30 nanometers.

12. The article as claimed in claim 1, wherein a thickness of the nitrogen-hydrogen doped diamond like carbon layer is in a range from about 1 nanometer to about 50 nanometers.

13. The article as claimed in claim 12, wherein a thickness of the nitrogen-hydrogen doped diamond like carbon layer is in a range from about 10 nanometers to about 30 nanometers.

14. The article as claimed in claim 1, wherein a thickness of the hydrogen-doped diamond like carbon layer is in a range from about 1 nanometer to about 50 nanometers.

15. The article as claimed in claim 14, wherein a thickness of the hydrogen-doped diamond like carbon layer is in a range from about 10 nanometers to about 30 nanometers.

* * * * *